(12) United States Patent
Takezawa et al.

(10) Patent No.: US 9,234,275 B2
(45) Date of Patent: Jan. 12, 2016

(54) METHOD AND APPARATUS OF FORMING METAL COMPOUND FILM, AND ELECTRONIC PRODUCT

(71) Applicant: TOKYO ELECTRON LIMITED, Tokyo (JP)

(72) Inventors: Yoshihiro Takezawa, Nirasaki (JP); Katsushige Harada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 13 days.

(21) Appl. No.: 14/102,792

(22) Filed: Dec. 11, 2013

(65) Prior Publication Data

US 2014/0161706 A1    Jun. 12, 2014

(30) Foreign Application Priority Data

Dec. 11, 2012   (JP) ................................. 2012-270670

(51) Int. Cl.

| C23C 16/00 | (2006.01) |
|---|---|
| C23C 16/30 | (2006.01) |
| C23C 16/40 | (2006.01) |
| C23C 16/455 | (2006.01) |
| H01L 21/02 | (2006.01) |
| H01L 21/28 | (2006.01) |
| C23C 16/06 | (2006.01) |
| H01L 29/51 | (2006.01) |

(52) U.S. Cl.
CPC ............. *C23C 16/308* (2013.01); *C23C 16/401* (2013.01); *C23C 16/45531* (2013.01); *H01L 21/0228* (2013.01); *H01L 21/02148* (2013.01); *H01L 21/02219* (2013.01); *H01L 21/02274* (2013.01); *H01L 21/28194* (2013.01); *H01L 21/28229* (2013.01); *H01L 29/517* (2013.01)

(58) Field of Classification Search
CPC .................. C23C 16/45531; C23C 16/45527; C23C 16/401; C23C 16/308; H01L 21/0228
USPC .......................................... 427/248.1, 255.32
See application file for complete search history.

(56) References Cited

U.S. PATENT DOCUMENTS

2005/0271812 A1* 12/2005 Myo et al. ................... 427/248.1
2009/0253229 A1* 10/2009 Nakagawa ..................... 438/104

FOREIGN PATENT DOCUMENTS

| JP | 2002-060944 A | 2/2002 |
|---|---|---|
| JP | 2005-116727 A | 4/2005 |
| JP | 2005-536064 A | 11/2005 |
| JP | 2007-088113 A | 4/2007 |
| JP | 2009-545138 A | 12/2009 |
| WO | 2004/093179 A1 | 10/2004 |
| WO | 2005/027189 A2 | 3/2005 |
| WO | 2005/113855 A1 | 12/2005 |

* cited by examiner

*Primary Examiner* — Kelly M Gambetta
(74) *Attorney, Agent, or Firm* — Nath Goldberg & Meyer; Jerald L. Meyer

(57) ABSTRACT

Provided is a method of forming a film of metal compound of first and second materials on an object to be processed, one of the first and second materials being metal, which includes: supplying a raw material gas containing the first material to the object such that the first material is adsorbed onto the object; supplying a raw material gas containing the second material to the object with the first material adsorbed thereon such that the second material is adsorbed onto the object with the first material adsorbed thereon; and supplying a third material different from the first and second materials onto the first and second materials adsorbed onto the object such that the first to third materials are chemically combined with one another.

10 Claims, 11 Drawing Sheets

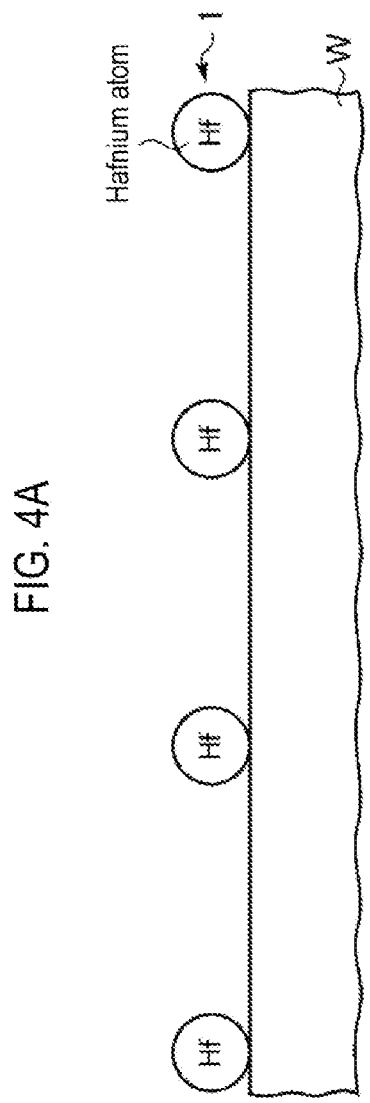

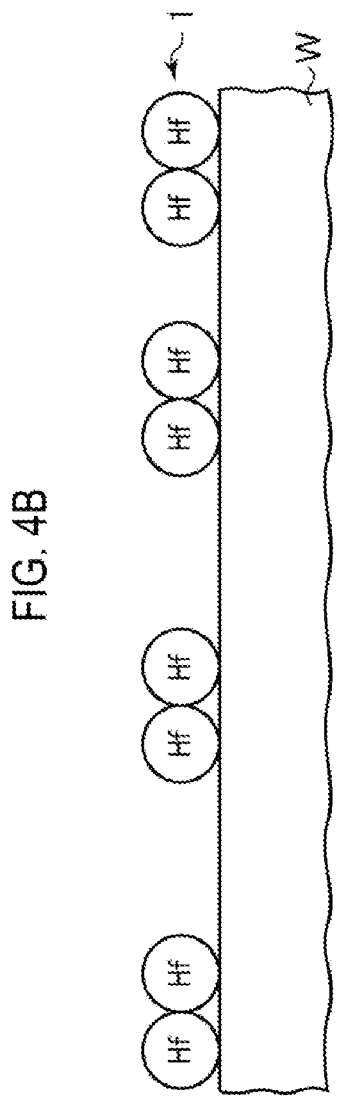

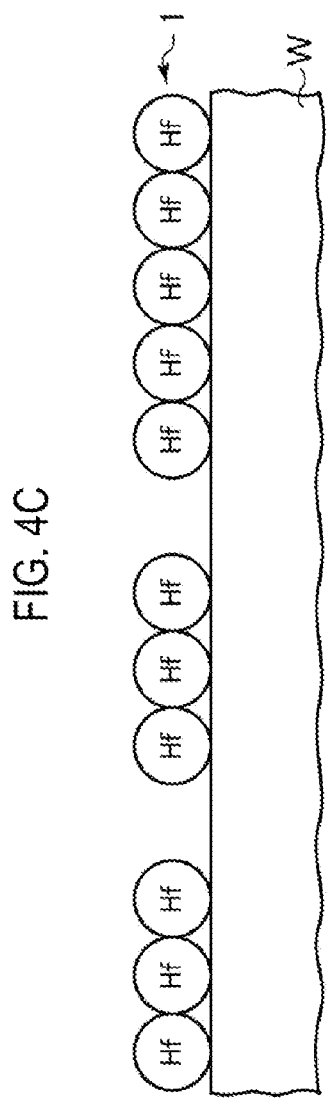

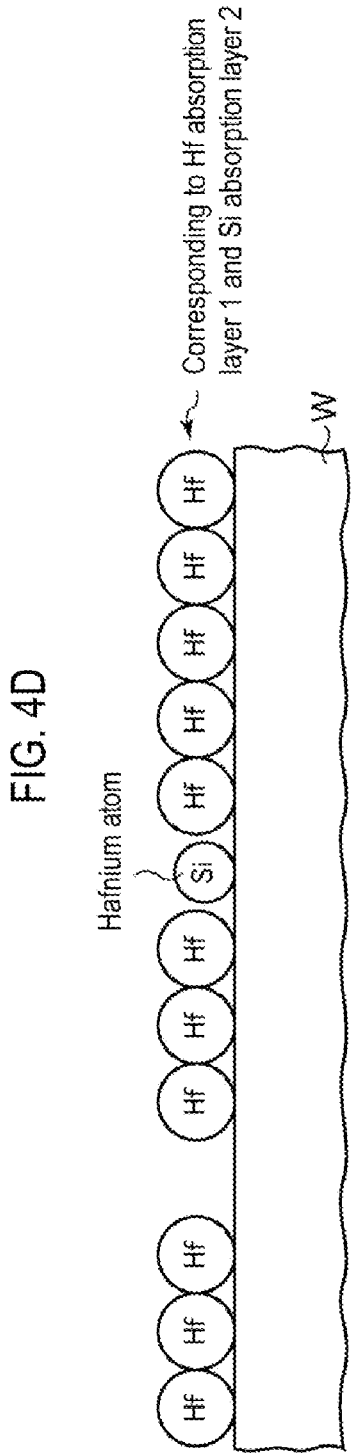

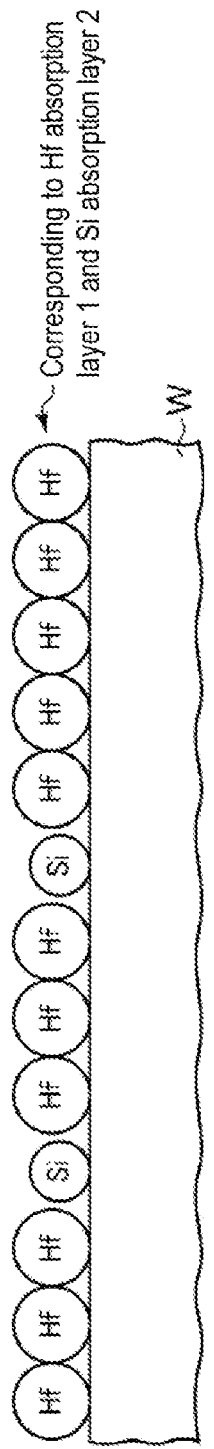

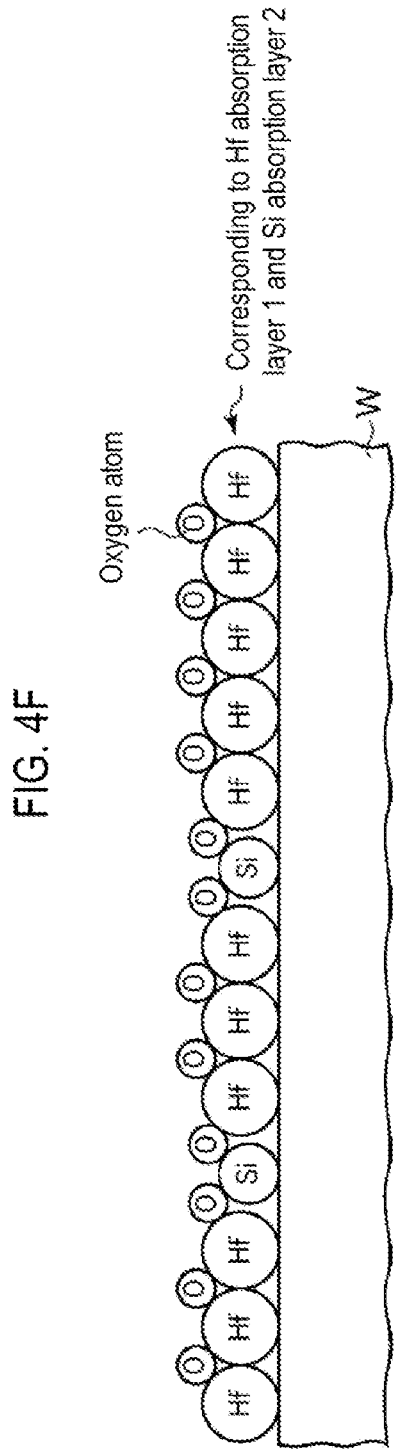

METHOD AND APPARATUS OF FORMING METAL COMPOUND FILM, AND ELECTRONIC PRODUCT

CROSS-REFERENCE TO RELATED APPLICATION

This application claims the benefit of Japanese Patent Application No. 2012-270670, filed on Dec. 11, 2012, in the Japan Patent Office, the disclosure of which is incorporated herein in its entirety by reference.

TECHNICAL FIELD

The present disclosure relates to a method and apparatus of forming a metal compound film, and an electronic product.

BACKGROUND

In recent years, miniaturization of a semiconductor integrated circuit device has progressed. Silicon dioxide ($SiO_2$) has been used for a gate insulation film of a transistor. However, as the miniaturization of the transistor progresses, the gate insulation film becomes thinner to such an extent that an insulation property thereof is no longer maintained due to penetration of electrons through the $SiO_2$ film by a tunneling effect. Thus, using a High-k (high dielectric constant) material having a relative dielectric constant higher than the $SiO_2$ material was considered. A gate insulation film having a high dielectric constant by using a High-k material has an increased effective film thickness (compared with using $SiO_2$) to thereby break through the limit of the miniaturization caused by the tunneling effect.

The High-k material is selected from metal compounds, e.g., a metal oxide and a metal nitride. A typical High-k material is a hafnium silicate ($HfSiO_x$).

One of the methods of forming such a HfSiOx film described in the related art includes a sequence of steps as follows:

(1) supplying a hafnium (Hf) gas (raw material gas) to form a Hf layer on a substrate;

(2) supplying an oxidizing agent gas to oxidize the Hf layer such that a HfOx (hafnium oxide) layer is formed;

(3) supplying a silicon (Si) precursor gas (raw material gas) to form a Si layer on the HfOx layer; and (4) supplying an oxidizing agent gas to oxidize the Si layer such that a SiOx (silicon oxide) layer is formed.

By repeating the sequence of steps (1) to (4), lamination of the HfOx layer and the SiOx layer are performed. Such a lamination process is repeated until a thickness of a laminated structure reaches a designed thickness. Thus, an HfSiOx film, which is a lamination by the HfOx layer and the SiOx layer, is formed.

The High-k material represented by the HfSiOx film is expected to be used as a material of a dielectric film of a capacitor, in addition to the gate insulation film.

One method using the High-k material for the dielectric film described in the related art includes a step of simultaneously or continuously supplying a Hf precursor gas and a Si precursor gas to adsorb them onto a substrate (a first step). Although the related art describes chemical/physical absorption onto the substrate surface, not the adsorption, in a certain section thereof, the chemical absorption may have substantially the same meaning as the chemical adsorption. Further, if chemical adsorption was intended, a HfSix layer (hafnium silicide) would be formed on the substrate. The method further includes a step of supplying an oxidizing agent gas to oxidize the adsorption layer, i.e., the HfSix layer such that an HfSiOx layer is formed (a second step). By repeating the first and second steps, the HfSiOx layer is laminated. Such a lamination process is repeated until a thickness of a laminated structure which is obtained by laminating the HfSiOx layer reaches a designed thickness. Thus, an HfSiOx film is formed.

Strictly speaking, characteristic or property of the HfSiOx film varies depending on a composition ratio of Hf and Si. A variation in characteristic or property which is caused by a change in the composition ratio has been regarded as being within an acceptable range, and thus has not been a problem. However, as a reduction in thickness further progresses, even if a slight variation in characteristic or property occurs, it is remarkably seen that such a variation has a huge effect on the semiconductor integrated circuit device. Accordingly, in order to obtain an optimal characteristic or property for an intended purpose of the HfSiOx film, it is required to adjust the composition ratio of Hf and Si delicately and with a high degree of accuracy.

The first related art does not teach such a method of adjusting the composition ratio. However, in case the adjustment of the composition ratio is required, the composition ratio would be adjusted by a thickness of the Hf film that is formed in step (1) and a thickness of the Si film that is formed in step (3).

Similarly, the second related art does not teach the method of adjusting the composition ratio, either. However, in case adjusting the composition ratio is required, the composition ratio would be adjusted by the amount of each of the Hf raw material gas and the Si raw material gas, which are supplied in step (1).

In the case where the HfSiOx film is used as the gate insulation film and the capacitor dielectric film, which are required to have a further reduced thickness, the composition ratio of Hf and Si is occasionally required to be drastically adjusted.

Obtaining a Hf-rich HfSiOx film having the composition ratio of Hf:Si, e.g., 90:10 to 95:5 is an example of such a case. In obtaining the HfSiOx film like this, the laminating of the HfOx layer and the SiOx layer as described in the first related art has problems in that the composition ratio of Hf and Si is limited by a growth rate of the Si film. Further, under a thin film thickness condition, it may be difficult to obtain the desired composition ratio. Let's suppose that a formable minimum thickness of the Si film is, e.g., 1nm. Then, when the composition ratio of Hf and Si is 90:10, the Hf film needs to have a film thickness of 9 nm.

In other words, in the method of laminating the HfOx layer and the SiOx layer, the formation of the HfSiOx film, in which the composition ratio of Hf and Si is 90:10, has a limitation in thickness of approximately 10 nm (1 nm+9 nm). In addition, when the composition ratio of Hf and Si is 95:5, a required thickness of the Hf film is 19 nm. As a result, the formation of the HfSiOx film, in which the composition ratio of Hf and Si is 95:5, has a limitation in thickness of approximately 20 nm (1 nm+19 nm).

In the method of laminating the HfSiOx layer as described in the second related art, a proportion of Hf is decreased while that of Si is increased when wafer temperature is increased. According to the second related art, when the wafer temperature is 350 degrees C., the proportions of Hf and Si atoms in the HfSiOx film are 20.3% and 10.9%, respectively, whereas when the wafer temperature is 400 degrees C., the proportions of Hf and Si atoms in the HfSiOx film are 18.5% and 13.3%, respectively. As described above, in the method of laminating the HfSiOx layer, there is a tendency that the proportion of Hf is decreased and that of Si is increased along with the increase in wafer temperature. This makes it difficult to significantly increase the proportion of Hf to Si, thus resulting in a deteriorated flexibility for adjustment of the composition ratio. Further, in the second related art, the oxidizing process is repeated in each supply of the Hf precursor gas and the Si precursor gas. This makes it difficult to obtain the Hf-rich HfSiOx film having, e.g., the composition ratio of Hf:Si=90:10 to 95:5.

SUMMARY

Some embodiments of the present disclosure provide a method and apparatus of forming a metal compound film, which are capable of extending the limit of the composition ratio and enhancing the degree of freedom in adjusting the composition ratio even when the thickness of a thin film is thin, and an electronic product manufacturing method using the film forming method, and an electronic product manufactured thereby.

According to one embodiment of the present disclosure, provided is a method of forming a film of metal compound of first and second materials on an object to be processed, one of the first and second materials being metal, which includes: supplying a raw material gas containing the first material to the object such that the first material is adsorbed onto the object; supplying a raw material gas containing the second material to the object with the first material adsorbed thereon such that the second material is adsorbed onto the object with the first material adsorbed thereon; and supplying a third material different from the first and second materials onto the first and second materials adsorbed onto the object such that the first to third materials are chemically combined with one another, wherein the supplying the raw material gas containing the first material is repeated at least two times based on a target composition ratio of the first material and the second material; wherein the supplying the raw material gas containing the second material is performed at least one-time based on the target composition ratio of the first material and the second material; and wherein the supplying the third material is performed at least one-time.

According to another embodiment of the present disclosure, provided is an apparatus of forming a film of a metal compound of first and second materials on an object to be processed, one of the first and second materials being a metal, which includes: a processing chamber in which a predetermined film forming process is performed on the object; a first gas supply mechanism configured to supply a first raw material gas containing the first material into the processing chamber; a second gas supply mechanism configured to supply a second raw material gas containing the second material into the processing chamber; a third gas supply mechanism configured to supply gas of a third material different from the first and second materials into the processing chamber; an inert gas supply mechanism configured to supply an inert gas into the processing chamber; an exhaust mechanism configured to exhaust an interior of the processing chamber; and a control unit configured to control the film forming apparatus, wherein the control unit controls the apparatus according to the aforementioned method.

According to another embodiment of the present disclosure, provided is an electronic product including a film of a metal compound of first and second materials, one of the first and second materials being metal, wherein the metal compound film is formed by the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A to 4F are cross sectional views schematically showing a second adsorption mode for Hf and Si.

DETAILED DESCRIPTION

Figure 1:
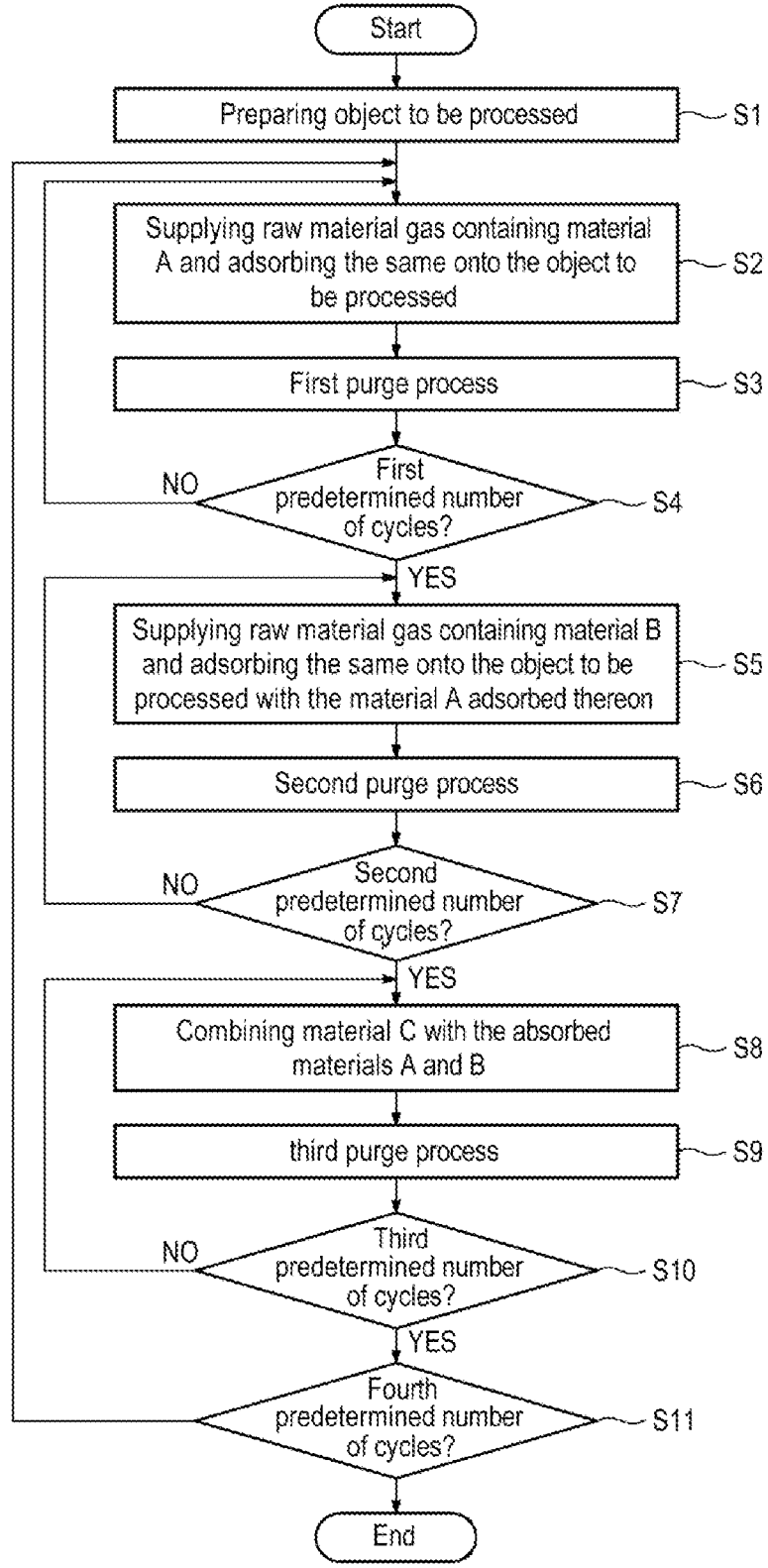
FIG. 1 is a flowchart illustrating an example of a method of forming a metal compound film according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the drawings, like reference numerals denote like elements.

First Embodiment

FIG. 1 is a flowchart illustrating an example of a method of forming a metal compound film according to a first embodiment of the present disclosure. FIGS. 2A to 2D are cross sectional views schematically showing main steps of the metal compound film forming method.

In the first embodiment, as an example, a hafnium silicate (hereinafter, referred to as an "HfSiOx") is formed into the metal compound film.

Figure 2A:
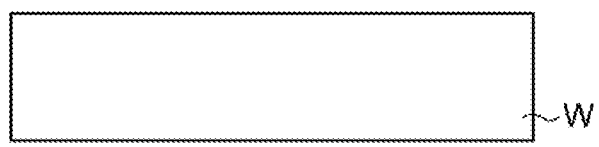
FIGS. 2A to 2D are cross sectional views schematically showing main steps of the film forming method.

First, as shown in Step S1 of FIG. 1 and FIG. 2A, an object to be processed is prepared. A silicon wafer W is used as an example of the object to be processed. The silicon wafer W is received in a processing chamber of a film forming apparatus (which will be described later with reference to FIG. 5).

Figure 2B:
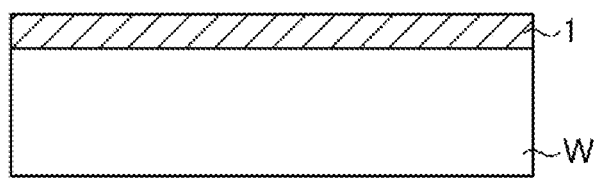

Subsequently, as shown in Step S2 of FIG. 1 and FIG. 2B, a raw material gas containing a material A is supplied to the silicon wafer W, which is received in the processing chamber, such that the material A is adsorbed onto the silicon wafer W (the object to be processed). In this embodiment, hafnium (Hf) is used as the material A. An example of the raw material gas containing the material Hf may include tetrakis(dimethylamino)hafnium (TDMAH). Thus, an Hf adsorption layer 1 is formed on the silicon wafer W. An example of adsorption process condition is as follows:

Raw material gas: TDMAH
Flow rate of raw material gas: 1 g/min
Process pressure: 13.3 Pa to 266 Pa (0.1 to 2 Torr)
Process temperature: 250 degrees C.
Process time: 30 sec
(where, 1 Torr is defined as 133 Pa in the description.)

As shown in Step S3 of FIG. 1, the adsorption process of Step S2 is followed by a first purge process in which the interior of the processing chamber that underwent Step S2 is exhausted and purged with an inert gas. An example of the inert gas is nitrogen ($N_2$).

Subsequently, as shown in Step S4 of FIG. 1, it is determined whether or not the number of repetitions of the sequence of Steps S2 and S3 is a first predetermined number of cycles. If the determination result is NO, the sequence of Steps S2 and S3 is repeated until the first predetermined number of cycles is reached. If the determination result is YES, control goes to Step S5.

Figure 2C:
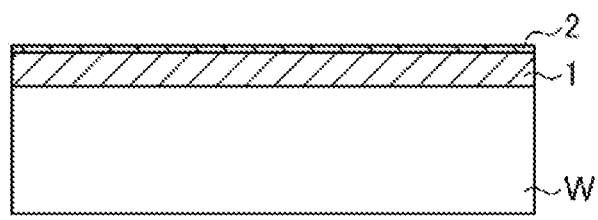

As shown in Step S5 of FIG. 1 and FIG. 2C, a raw material gas containing a material B is supplied to the silicon wafer W with the Hf adsorbed thereon such that the material B is adsorbed onto the silicon wafer W (the object to be processed). In this embodiment, a silicon (Si) is used as the material B. An example of the raw material gas containing the material Si is diisopropylaminosilane (DIPAS). Thus, a Si adsorption layer 2 is formed on the silicon wafer W with the Hf adsorption layer 1 formed thereon. An example of such adsorption process conditions is as follows:

Raw material gas: DIPAS
Flow rate of raw material gas: 250 sccm
Process pressure: 13.3 Pa to 13,300 Pa (0.1 to 100 Torr)
Process temperature: 250 degrees C.
Process time: 30 sec Subsequently, as shown in Step S6 of FIG. 1, the adsorption process of Step S5 is followed by a second purge process in which the interior of the processing chamber that underwent Step S5 is exhausted and then purged with an inert gas. As described above, an example of the inert gas is nitrogen ($N_2$).

Thereafter, as shown in Step S7 of FIG. 1, it is determined whether or not the number of repetitions of the sequence of Steps S5 and S6 equals to a second predetermined number of cycles. If the determination result is NO, Steps S5 and S6 are repeated until the number of repetitions reaches the second predetermined number of cycles. If the determination result is YES, control goes to Step S8. It may be possible to set the second predetermined number of cycles in Step S7 to one.

Figure 2D:
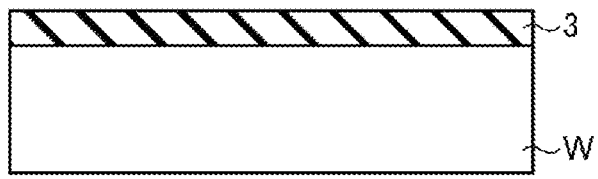

Subsequently, as shown in Step S8 of FIG. 1 and FIG. 2D, a material C which is different from the material A (i.e., Hf) and the material B (i.e., Si) adsorbed onto the silicon wafer W is supplied to the silicon wafer W such that the material C is chemically combined with Hf and Si. In this embodiment, the material C is oxygen (hereinafter referred to as "O") and the chemical combination is an oxidation process. An example of an oxidizing gas is an ozone gas ($O_3$). Thus, the Hf adsorption layer 1 and the Si adsorption layer 2 are oxidized to form an HfSiOx film 3. An example of conditions for such oxidizing process is as follows:

Oxidizing agent gas: $O_3$
Flow rate of oxidizing agent gas: 10,000 sccm
Process pressure: 13.3 to 266 Pa (0.1 to 2 Torr)
Process temperature: 250 degrees C.
Process time: 60 sec As shown in Step S9 of FIG. 1, the chemical combination process is followed by a third purge process in which the interior of the processing chamber that underwent Step S8 is exhausted and then purged with an inert gas. As described above, an example of the inert gas is nitrogen ($N_2$).

A sequence of Steps S8 and S9 may be performed only one-time or may be repeated two or more times. In case the sequence of Steps S8 and S9 is repeated two or more times, it is determined in Step S10 whether or not the number of repetitions of the sequence of Steps S8 and S9 is a third predetermined number of cycles. If the determination result is NO, the sequence of Steps S8 and S9 is repeated until the repetition number reaches the third predetermined number of cycles. If the determination result is YES, control goes to Step S11. It may be possible to set the third predetermined number of cycles in Step S10 to one.

Subsequently, as shown in Step S11 of FIG. 1, it is determined in Step S11 whether or not the number of repetitions of the sequence of Steps S2 to S9 is a fourth predetermined number of cycles. If the determination result is NO, it is determined that a film thickness of the HfSiOx film 3 did not reach a designed film thickness. Thus the sequence of Steps S2 to S9 is continuously performed until the number of repetition reaches the fourth predetermined number of cycles. If the determination result is YES, it is determined that the film thickness of the HfSiOx film 3 reaches the designed film thickness. Thus, the film forming process is terminated. It may be possible to set the fourth predetermined number of cycles in Step S11 to one.

In some embodiments, Step S2 may be repeated at least two times and Step S5 may be repeated at least one-time, according to a target composition ratio of Hf and Si.

By performing each of Steps S2 and S5 in this way, Hf and Si, each having a number of atoms corresponding to the target composition ratio of Hf and Si, can be adsorbed to form the Hf adsorption layer 1 and the Si adsorption layer 2. Further, the sequence of Steps S2 to S9 is repeated until the film thickness of the HfSiOx film 3 reaches the designed thickness, thus forming the metal compound film (the HfSiOx film 3 in this embodiment).

<First Adsorption Mode>

Figure 3A:
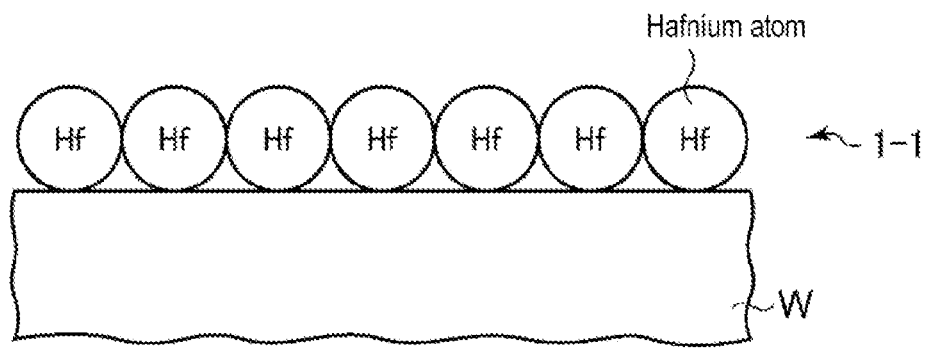
FIGS. 3A to 3E are cross sectional views schematically showing a first adsorption mode for Hf and Si.
Figure 3B:
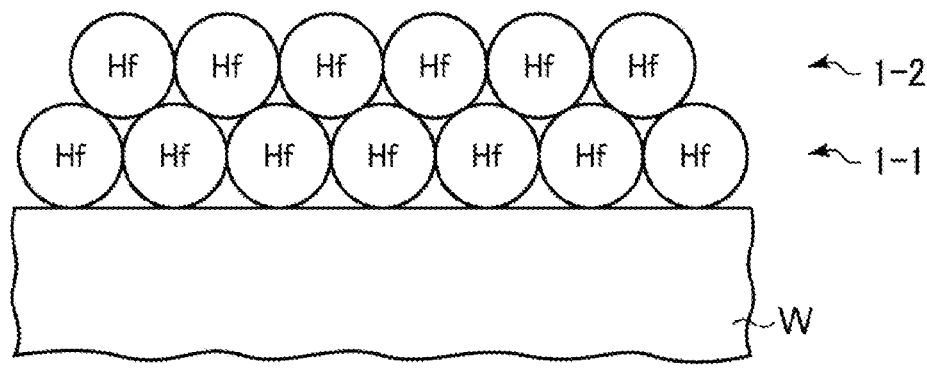
Figure 3C:
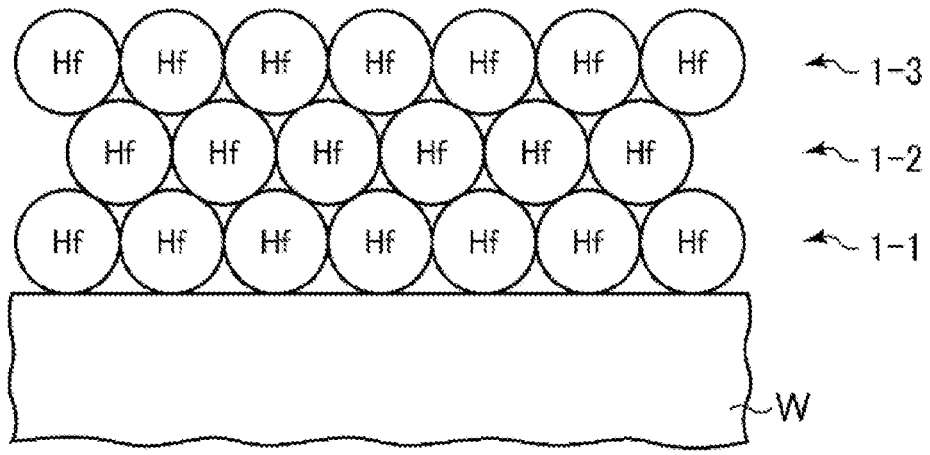

FIGS. 3A to 3E are cross sectional views schematically showing a first adsorption mode for Hf and Si. As shown in FIG. 3A, it is assumed that, e.g., the Hf adsorption layer 1 of one atomic layer is formed by a single operation of Step S2. Then, when Step S2 is performed three times, as shown in FIGS. 3B and 3C, the Hf adsorption layer 1 having three atomic layers (i.e., first to third Hf atomic layers 1-1 to 1-3) can be obtained.

Figure 3D:
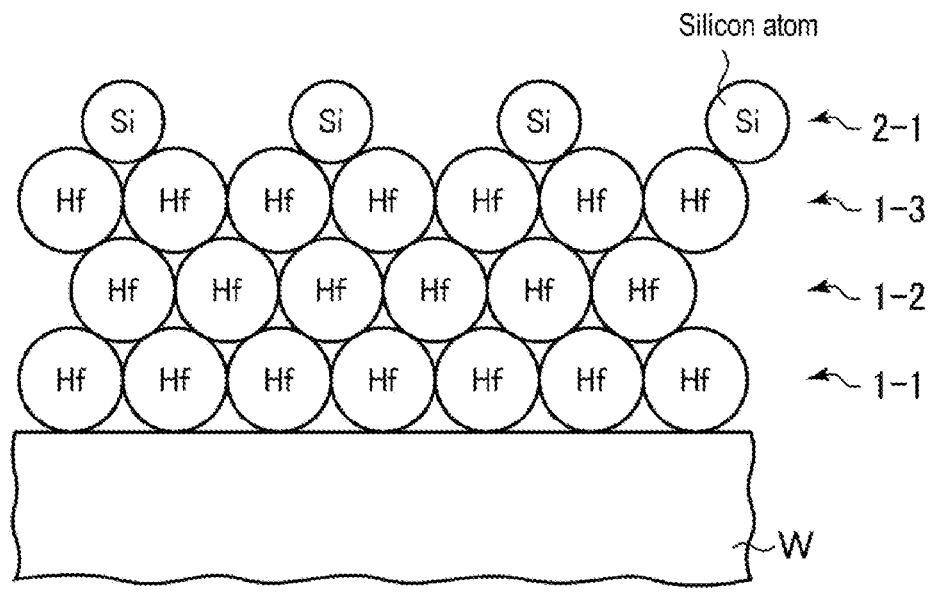

Subsequently, as shown in FIG. 3D, it is assumed that, e.g., the Si adsorption layer 2 of one atomic layer is formed by a single operation of Step S5. By the single operation of Step S5, the Si adsorption layer 2 of one atomic layer (i.e., a first Si atomic layer 2-1) can be obtained. Further, although not shown in FIG. 3D, upon performing Step S5 twice, the Si adsorption layer 2 of two atomic layers (i.e., the first Si atomic layer 2-1 and a second Si atomic layer (not shown)) can be obtained.

Figure 3E:
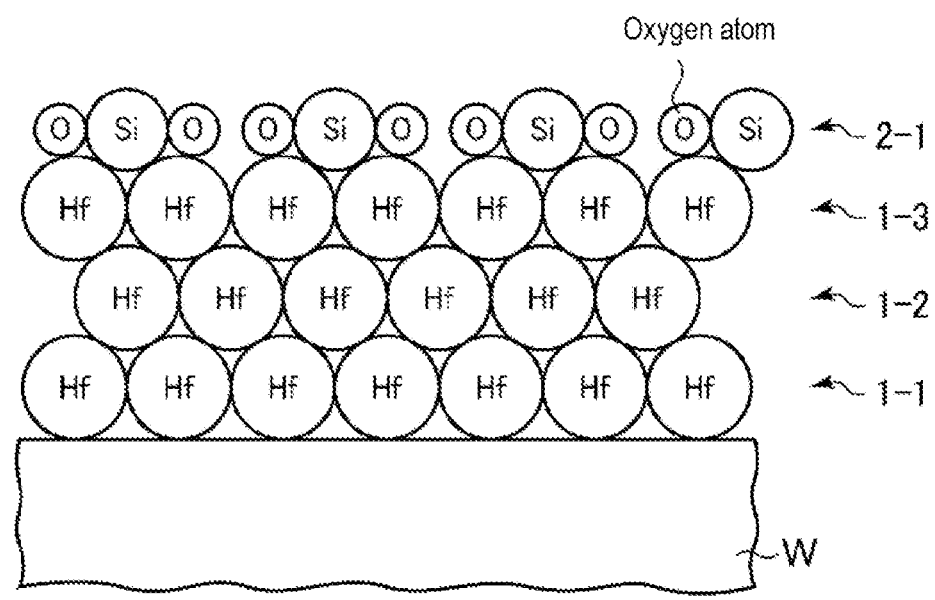

In this manner, for example, each of the numbers of lamination in the Hf adsorption layer 1 (i.e., the first to third Hf atomic layers 1-1 to 1-3) and the Si adsorption layer 2 (i.e., the first Si atomic layer 2-1) is set based on the target composition ratio of Hf and Si. Thereafter, as shown in FIG. 3E, the Hf adsorption layer 1 (i.e., the first to third Hf atomic layers 1-1 to 1-3) and the Si adsorption layer 2 (i.e., the first Si atomic layer 2-1) are subjected to the oxidizing process (in Step S8).

According to the film forming method having the first adsorption mode as described above, it is possible to obtain the Hf-rich HfSiOx film 3 having a composition ratio of Hf:Si, e.g., 90:10 to 95:5.

While the formation of HfSiOx film 3 can be completed by performing the first adsorption mode as shown in FIGS. 3A to 3E one-time, the first adsorption mode may be repeated until the HfSiOx film 3 has the designed thickness. In either way, it is possible to obtain the Hf-rich HfSiOx film 3.

<Second Adsorption Mode>

In the first adsorption mode, each of the numbers of lamination in the Hf adsorption layer 1 (i.e., the first to third Hf atomic layers 1-1 to 1-3) and the Si adsorption layer 2 (i.e., the first Si atomic layer 2-1) has been described to be set based on the target composition ratio of Hf and Si. The first adsorption mode may be applied to a case where the film thickness of the HfSiOx film 3 is thick.

In contrast, the second adsorption mode may be applied to a case where the film thickness of the HfSiOx film 3 is thin. Specifically, in the second adsorption mode, Hf and Si atoms are adsorbed onto adsorption sites of a surface of the object to be processed, e.g., a limited number of adsorption sites on the surface of the silicon wafer W.

FIGS. 4A to 4F are cross sectional views schematically showing the second adsorption mode for Hf and Si. As shown in FIG. 4A, it is assumed that, e.g., a plurality of Hf atoms is adsorbed onto several adsorption sites of the surface of the silicon wafer W by a single operation of Step S2. Upon repeating Step S2, e.g., three times, as shown in FIGS. 4B and 4C, the plurality of Hf atoms is sequentially adsorbed onto the adsorption sites on the surface of the silicon wafer W.

Subsequently, as shown in FIG. 4D, a Si atom is adsorbed onto the remaining site(s) of the surface of the silicon wafer W (in Step S5). Step S5 may be performed only once and, in the case where all atoms are not completely adsorbed, Step S5 may be performed two or more times until the Si atoms are completely adsorbed onto the remaining sites, as shown in FIG. 4E.

In this manner, the adsorption sites on the surface of the object to be processed (i.e., the silicon wafer W) are filled with the Hf and Si atoms based on the target composition ratio of Hf and Si. Meanwhile, a proportion of Hf may be determined based on the number of operations of Step S2, and a proportion of Si may be determined based on the number of operations of Step S5. Subsequently, as shown in FIG. 4F, the adsorbed Hf and Si atoms are subjected to, e.g., oxidization (in Step S8). Thus, it is possible to obtain a very thin Hf-rich HfSiOx film 3 having composition ratio of Hf:Si, e.g., 90:10 to 95:5.

The formation of HfSiOx film 3 can be completed by performing the second adsorption mode as shown in FIGS. 4A to 4F once. However, the second adsorption mode may be repeated until the HfSiOx film 3 has the designed thickness, similar to the first adsorption mode.

In addition, one of the first adsorption mode and the second adsorption mode may be changed to the other by adjusting a process time, a flow rate of the raw material gas or the like. As an example, the mode may become the first adsorption mode by prolonging the process time and increasing the flow rate of the raw material gas; and the mode may become the second adsorption mode by shortening the process time and decreasing the flow rate of the raw material gas.

Further, as can be appreciated from the second adsorption mode, it may be preferred in some embodiments that out of the materials A (Hf in this embodiment) and B (Si in this embodiment), the material A for which the adsorption process is performed first is selected to be contained in the metal compound film (the HfSiOx film 3 in this embodiment) at a relatively high proportion. The reason for this is that the material which has been first subjected to the adsorption process is likely to occupy more adsorption sites on the surface of the object to be processed. In the first embodiment, the adsorption process of Hf is performed first and then the adsorption process of Si follows. This sequence allows the Hf-rich HfSiOx film 3 to be obtained. On the contrary, if the adsorption process of Si is performed first and followed by the adsorption process of Hf, a Si-rich HfSiOx film 3 may be obtained.

As described above, according to the metal compound film forming method in accordance with the first embodiment of the present disclosure, it is possible to extend the limit to the composition ratio of Hf and Si even under thin film thickness condition.

Further, as described above, the composition ratio of Hf and Si can be adjusted by controlling the number of laminations in the Hf adsorption layer 1 and the Si adsorption layer 2 or the number of atoms of the Hf and Si adsorbed onto the adsorption sites on the surface of the object to be processed, which makes it possible to enhance the degree of freedom in adjusting the composition ratio of Hf and Si.

Second Embodiment

The following is a description of an example of a film forming apparatus 100 according to a second embodiment, which is capable of performing the metal compound film forming method according to the first embodiment of the present disclosure.

Figure 5:
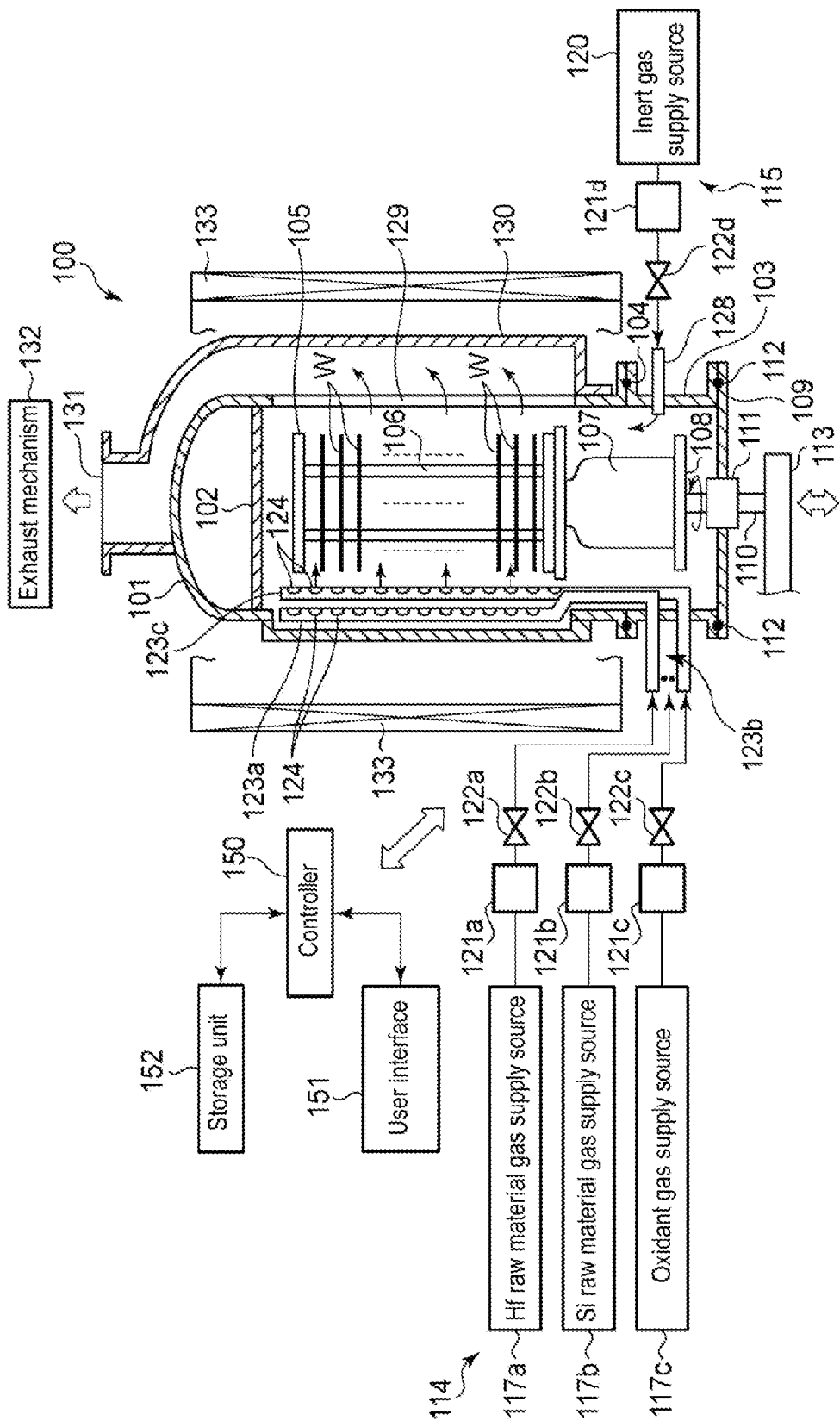
FIG. 5 is a longitudinal sectional view schematically showing a film forming apparatus according to a second embodiment of the present disclosure.

FIG. 5 is a longitudinal sectional view schematically showing the film forming apparatus 100 according to the second embodiment of the present disclosure.

As shown in FIG. 5, the film forming apparatus 100 includes a cylindrical-shaped processing chamber 101 having a ceiling and an opened lower end portion. The entirety of the processing chamber 101 is formed of, e.g., quartz. A ceiling plate 102 made of quartz is disposed at the ceiling of the processing chamber 101. Further, for example, a cylindrical manifold 103 formed of stainless steel is connected to a lower end opening portion of the processing chamber 101 through a seal member 104 such as an O-ring.

The manifold 103 supports a lower end portion of the processing chamber 101. A wafer boat 105 made of quartz, in which a plurality of (e.g., fifty to one hundred) semiconductor substrates (the silicon wafers W in this embodiment) can be loaded as objects to be processed in multiple stages, is insertable into the processing chamber 101 through a lower portion of the manifold 103. Accordingly, the silicon wafers W are received in the processing chamber 101. The wafer boat 105 includes multiple support pillars 106, and the plurality of silicon wafers W are supported by grooves formed in the support pillars 106.

The wafer boat 105 is loaded on a table 108 through a heat insulating tube 107 made of quartz. The table 108 is supported by a rotation shaft 110 passing through a cover part 109 made of the stainless steel which opens or closes a lower end opening of the manifold 103. For example, a magnetic fluid seal 111 is disposed at the portion through which the rotation shaft 110 passes, to rotatably support the rotation shaft 110 in an airtight manner. Further, a seal member 112 of, e.g., an O-ring is disposed between a peripheral portion of the cover part 9 and the lower end of the manifold 103, thus maintaining a sealed condition in the processing chamber 101. The rotation shaft 110, for example, is disposed at a front end of an arm 113 supported by a raising/lowering device such as a boat elevator. Accordingly, the wafer boat 105, the cover part 109 and the like, are raised or lowered to be inserted into or detached from the processing chamber 101.

The film forming apparatus 100 includes a process gas supply mechanism 114 configured to supply a process gas into the process chamber 101, and an inert gas supply mechanism 115 configured to supply an inert gas into the process chamber 101.

The process gas supply mechanism 114 according to this embodiment includes an Hf raw material gas supply source 117a containing a hafnium (Hf) raw material gas as the material A, a Si raw material gas supply source 117b containing a silicon (Si) raw material gas as the material B, and an oxidizing agent gas supply source 117c.

The inert gas supply mechanism 115 includes an inert gas supply source 120.

An example of the Hf raw material gas may be TDMAH, an example of the Si raw material gas may be DIPAS, and an example of the oxidizing agent gas may be an ozone gas. An example of the inert gas may be a nitrogen gas. The inert gas is used as a purge gas or the like.

The Hf raw material gas supply source 117a is connected to a first dispersing nozzle 123a through a flow controller 121a and an on-off valve 122a. Similarly, the Si raw material gas supply source 117b is connected to a second dispersing nozzle 123b (shown by only the numerical number in FIG. 5, for the sake of simplicity) through a flow controller 121b and an on-off valve 122b. The oxidizing agent gas supply source 117c is connected to a third dispersing nozzle 123c through a flow controller 121c and an on-off valve 122c.

Each of the first to third dispersing nozzles 123a to 123c formed in a quartz tube extends through a sidewall of the manifold 103 inward and forms a vertically extending portion being bent upward. At the vertically extending portion of each of the first to third dispersing nozzles 123a to 123c, a plurality of gas discharge holes 124 is formed spaced apart from each other at predetermined intervals. With this configuration, each gas is approximately uniformly discharged from the respective gas discharge holes 124 into the process chamber 101 in a horizontal direction.

The inert gas supply source 120 is connected to a nozzle 128 through a flow controller 121d and an on-off valve 122d. The nozzle 128 extends through the sidewall of the manifold 103 to horizontally discharge the inert gas from its leading end into the processing chamber 101.

At a portion opposite the first to third dispersing nozzles 123a to 123c in the process chamber 101, an exhaust port 129 is formed to exhaust the process chamber 101. The exhaust port 129 has an elongated shape formed by scraping the sidewall of the process chamber 101 in the vertical direction. At a portion corresponding to the exhaust port 129 of the process chamber 101, an exhaust port cover member 130 with its cross section of an approximately C-shape is installed by welding to cover the exhaust port 129. The exhaust port cover member 130 extends upward along the sidewall of the process chamber 101, and defines a gas outlet 131 at the top of the process chamber 101. An exhaust mechanism 132 equipped with a vacuum pump and the like is connected to the gas outlet 131. The exhaust mechanism 132 exhausts the process chamber 101 to discharge the process gas used for the process and keeps an internal pressure within the process chamber 101 into a predetermined process pressure required for the process.

A cylindrical body-shaped heating device 133 is installed around an outer periphery of the process chamber 101. The heating device 133 activates a gas supplied into the process chamber 101, and heats the objects to be processed (e.g., the silicon wafers W in this embodiment) that are loaded into the process chamber 101.

For example, respective components of the film forming apparatus 100 are controlled by a controller 150 implemented by, e.g., a microprocessor (a computer). The controller 150 is connected to a user interface 151 including a touch panel for an operator to input a command or the like to control the film forming apparatus 100, and a display unit for displaying an operative state of the film forming apparatus 100.

A storage unit 152 is connected to the controller 150. The storage unit 152 stores a control program for executing various processes in the film forming apparatus 100 via the control of the controller 150, and a program, i.e., a recipe for executing a process in each of the components of the film forming apparatus 100 based on process conditions. For example, the recipe is stored in a storage medium of the storage unit 152. The storage medium may include a hard disk, a semiconductor memory, and a portable memory such as a CD-ROM, a DVD, a flash memory or the like. The recipe may be suitably transmitted from another device through a dedicated line. If necessary, the recipe is read from the memory unit 152 in response to a command received from the user interface 151, and the controller 150 executes processes based on the read recipe. Accordingly, the film forming apparatus 100 performs a desired process under the control of the controller 150.

In the second embodiment, film forming processes based on the metal compound film forming method in accordance with the first embodiment are sequentially executed under the control of the controller 150.

Further, the metal compound film forming method according to the first embodiment may be performed by a single film forming apparatus, e.g., the film forming apparatus 100 shown in FIG. 5.

Further, the film forming apparatus 100 of the present disclosure is not limited to a batch-type one as shown in FIG. 5, but may be a single wafer-type film forming apparatus.

Third Embodiment

Next, a third embodiment of the present disclosure will be described as modified examples.
<Purge Gas>

First, a modified example of the purge gas will be described.

While in the first embodiment, the nitrogen gas is used as the purge gas, the present disclosure is not limited thereto as long as the purge gas is an inert gas. As an example, elements (rare gases) of Group 18 in the periodic table such as an argon gas may be used as the purge gas.

As described in the first embodiment, in the case where the HfSiOx film is formed as the metal compound film, it may be preferred in some embodiments to use the nitrogen gas as the purge gas. This is because the nitrogen can be contained in the HfSiOx film, thus forming a nitrogen-containing hafnium silicate (HfSiON) film. The HfSiON film has an advantage in that it has a low component separation property under a high temperature conditions, compared to the HfSiOx film.
<Step S8: Chemically Combining Material C with Adsorbed Materials A and B>

Next, a modified example of Step S8 will be described.

In Step S8, the ozone gas is selected as the material C, and the materials A and B are oxidized by the ozone gas to obtain an oxidized metal compound film. In the first embodiment, the oxidized metal compound film is the HfSiOx film 3.

An oxygen-containing gas may be used as the oxidizing agent. Further, examples of the oxidizing agent may include an oxygen ($O_2$) gas, a water vapor ($H_2O$) or the like, in addition to the ozone gas.

While, a thermal oxidation process by heating is used as the oxidation process in the first embodiment, the present disclosure is not limited thereto, and a plasma (radical) oxidation process, which turns oxygen contained in the oxidizing agent gas into plasma (radical), may be used as the oxidation process.

Alternatively, in addition to the oxidation process, a nitriding process, an oxynitriding process and so on may be used.

A nitrogen-containing gas may be used as a nitriding agent. Examples of the nitriding agent may include an ammonia ($NH_3$) gas or the like.

Examples of the nitriding process may include a thermal nitridation, a plasma (radical) nitridation process which turns nitrogen contained in the nitriding agent gas into plasma (radical), or the like.

An example of an oxynitriding agent may include a nitrogen oxide (NOx). When performing the oxynitriding process, the oxidizing agent and the nitriding agent may be simultaneously supplied into the processing chamber.

Similar to the oxidation and nitriding processes, the oxynitriding process may include a thermal oxynitriding process using heat, a plasma (radical) oxynitriding process which turns oxygen and nitrogen contained in the oxynitriding agent gas into plasma (radical), or the like.

<Metal>

Next, a modified example of the metal will be described.

In the first embodiment, the hafnium (Hf) was selected as an example of the metal. Further, the TDMAH was selected as an example of the Hf raw material gas. An example, the Hf raw material gas may include one selected from a group consisting of:

TDMAH (tetrakis(dimethylamino)hafnium),
TEMAH (tetrakis(ethylmethylamino)hafnium),
TDEAH (tetrakis(diethylamino)hafnium), and
Tris(dimethylamino)cyclopentadienyl)hafnium.

An example of one of the materials A and B may include one selected from a group consisting of:

Hafnium (Hf),
Zirconium (Zr),
Titanium (Ti), and
Aluminum (Al).

An example of the Zr-containing raw material gas may include one selected from a group consisting of:

TEMAZ (tetrakis(ethylmethylamino)zirconium), and
Tris(dimethylamino)cyclopentadienyl)zirconium).

An example of the Ti-containing gas may include one selected from a group consisting of:

$TiCl_4$ (titanium tetrachloride),
Pentamethyl cyclopentadienyl titanium trimethoxide, and
Methyl cyclopentadienyl trisdimethylamino titanium.

An example of the Al-containing gas may include TMA (trimethyl aluminum).

<Si>

In the first embodiment, the silicon (Si) was used as one of the materials A and B. An example of the Si raw material gas may include one selected from a group consisting of:

2DMAS (bis(dimethylamino)silane),
3DMAS (tri(dimethylamino)silane),
4DMAS (tetrakis(diethylamino)silane, and
DIPAS (diisopropylaminosilane).

While in the first embodiment, the Si was selected as one of the materials A and B, other elements of Group IV (elements of Group 14 of Periodic Table (IUPAC)) such as carbon (C), germanium (Ge) or the like may be selected.

<Applicable Uses of Metal Compound Film>

Next, applicable uses of the metal compound film formed according to the first embodiment will be described.

For example, the HfSiOx is a High-k (high permittivity) material having a relative dielectric constant higher than $SiO_2$. Thus, it can be used as a gate insulation film of a transistor, or a dielectric film of a capacitor in electronic products, e.g., a semiconductor integrated circuit device or a flat panel display. Especially, the metal compound film (e.g., the HfSiOx film 3) formed according to the first embodiment, by which the limit of the composition ratio may be extended and the degree of freedom in adjusting the composition ratio may be enhanced, may be effectively used as the gate insulation film and the dielectric film of the capacitor, even when it has a significantly thin thickness of, e.g., a finite value of 50 nm or lower.

Further, even if the gate insulation film and the dielectric film of the capacitor have a thickness of a finite value of lower than 10 nm, it is possible to form a HfSiOx film having its composition ratio of Hf:Si=90:10 by using the metal compound film forming method according to the first embodiment.

As described above, the metal compound film formed according to the first embodiment may be effectively used as the gate insulation film or the dielectric film of the capacitor in electronic products, e.g., semiconductor integrated circuit devices or flat panel displays. According to the present disclosure, it is possible to provide a method and apparatus of forming a metal compound film, which are capable of extending the limit of a composition ratio of the metal compound film and enhancing the degree of freedom in adjusting the composition ratio, even in thin film thickness conditions. Further, according to the present disclosure, it is possible to provide an electronic product manufacturing method using the film forming method, and an electronic product manufactured thereby.

While certain embodiments of the present disclosure have been described, the present disclosure is not limited to these embodiments and may be modified in a variety of other forms.

For example, although specific process conditions are illustrated in the above embodiments, the process conditions are not limited thereto. Alternatively, the process conditions may be properly varied depending on an internal volume of the processing chamber or the like.

Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a film of metal compound of first and second materials on an object to be processed, one of the first and second materials being metal, comprising:

supplying a raw material gas containing the first material to the object such that the first material is adsorbed onto the object;

supplying a raw material gas containing the second material to the object with the first material adsorbed thereon such that the second material is adsorbed onto the first material; and subsequently supplying a third material different from the first and second materials onto the first and second materials adsorbed onto the object such that the first to third materials are chemically combined with one another, wherein the supplying the raw material gas containing the first material is repeated at least two times based on a target composition ratio of the first material and the second material before supplying the raw material gas containing the second material;

wherein the supplying the raw material gas containing the second material is performed at least one-time based on the target composition ratio of the first material and the second material;

wherein the supplying the third material is performed at least one-time;

wherein the repetition number of the supplying the raw material containing the first material and the performance number of the supplying the raw material gas containing the second material are differently set based on the target composition ratio of the first material and the second material;

wherein the first material is Hf and the second material is Si; and wherein the first material gas and the second material gas are not supplied as a mixture of them.

2. The method of claim 1, wherein the supplying the raw material gas containing the first material, the supplying the raw material gas containing the second material and the supplying the third material are repeated until a film thickness of the metal compound film reaches a designed thickness.

3. The method of claim 1, wherein the chemical combination is one of oxidization, nitriding and oxynitriding processes.

4. The method of claim 1, further comprising: after the supplying the raw material gas containing the first material, purging an interior of a processing chamber in which the object is received.

5. The method of claim 1, further comprising: after the supplying the raw material gas containing the second material, purging an interior of a processing chamber in which the object is received.

6. The method of claim 1, further comprising: after the supplying the third material, purging an interior of a processing chamber in which the object to be processed is received.

7. The method of claim 4, wherein a nitrogen gas is used as a purge gas in the purging.

8. The method of claim 1, wherein the first material has a larger proportion than that of the second material in the metal compound film.

9. The method of claim 1, wherein the first material gas is one selected from a group consisting of:
   TDMAH (tetrakis(dimethylamino)hafnium),
   TEMAH (tetrakis(ethylmethylamino)hafnium),
   TDEAH (tetrakis(diethylamino)hafnium, and
   Tris(dimethylamino)cyclopentadienyl)hafnium.

10. The method of claim 1, wherein the second material gas is one selected from a group consisting of:
   2DMAS (bis(dimethylamino)silane),
   3DMAS (tri(dimethylamino)silane),
   4DMAS (tetrakis(diethylamino)silane, and
   DIPAS (diisopropylaminosilane).

* * * * *